United States Patent

Riccó et al.

[11] Patent Number: 5,942,936
[45] Date of Patent: Aug. 24, 1999

[54] OFFSET COMPENSATING METHOD AND CIRCUIT FOR MOS DIFFERENTIAL STAGES

[75] Inventors: Bruno Riccó; Massimo Lanzoni, both of Bologna, Italy

[73] Assignee: STMicroelctronics, S.r.l., Agrate Brianza, Italy

[21] Appl. No.: 08/777,418

[22] Filed: Dec. 30, 1996

[30] Foreign Application Priority Data

Dec. 29, 1995 [EP] European Pat. Off. ............... 95830549

[51] Int. Cl.[6] ....................................................... H03F 3/45
[52] U.S. Cl. ..................... 327/563; 327/562; 365/185.24; 365/185.28
[58] Field of Search ...................................... 327/560, 561, 327/562, 307; 330/253; 365/185.01, 185.14, 185.15, 185.24, 185.26, 185.28

[56] References Cited

U.S. PATENT DOCUMENTS

| | | | |
|---|---|---|---|
| 5,181,188 | 1/1993 | Yamauchi et al. | 365/228 |
| 5,218,568 | 6/1993 | Lin et al. | 365/185 |
| 5,430,670 | 7/1995 | Rosenthal | 365/45 |
| 5,557,234 | 9/1996 | Collins | 327/563 |

FOREIGN PATENT DOCUMENTS

| | | | |
|---|---|---|---|
| 0 244 628 | 11/1987 | European Pat. Off. | G11C 7/06 |
| 0 395 894 | 11/1990 | European Pat. Off. | G06G 7/16 |
| 2 543 363 | 9/1984 | France | H01L 27/02 |
| WO 93/17493 | 9/1993 | WIPO | H03F 3/45 |

*Primary Examiner*—Tuan T. Lam
*Attorney, Agent, or Firm*—Seed and Berry LLP; David V. Carlson; Kevin S. Ross

[57] ABSTRACT

To compensate the offset of a differential stage, the stage has at least one programmable, floating gate transistor with a programmable threshold, which is initially set to a threshold level other than the required threshold value, so that the differential stage is initially unbalanced. A balance input voltage is applied to the inputs of the differential stage. A programming voltage is applied to the programmable transistor to modify the set threshold until the differential stage switches. Upon switching, the programming voltage is cut off immediately, so that the charge required for the differential stage to be balanced with a balance input voltage is memorized in the programmable transistor.

22 Claims, 2 Drawing Sheets

OFFSET COMPENSATING METHOD AND CIRCUIT FOR MOS DIFFERENTIAL STAGES

TECHNICAL FIELD

The present invention relates to an offset compensating method and circuit for MOS differential stages.

BACKGROUND OF THE INVENTION

As is known, voltage offset is one of the most common and most annoying drawbacks of differential stages and differential-stage-based circuits (such as operational amplifiers, to which reference is made herein purely by way of example).

Of the various solutions proposed and currently implemented, none is entirely satisfactory in terms of performance and/or simplicity.

It is an object of the present invention to provide a method and circuit capable of almost fully compensating offset in a simple manner, with no need for complex compensating structures.

SUMMARY OF THE INVENTION

According to the present invention, there are provided an offset compensating method and circuit for MOS differential stages.

The present invention also relates to the use of electrically programmable transistors in a differential stage, for compensating offset.

The present invention is based on the possibility of using programmable transistors (by which are meant floating gate transistors, such as nonvolatile, i.e., EEPROM or flash, memory cells) and special transistor programming circuits in differential stages for eliminating offset. In practice, the differential stage features programmable transistors, one of which is set to a different (higher or lower) threshold level as compared with the desired threshold value, so that the differential stage is unbalanced even in the presence of a balanced input voltage. A programming voltage is then applied to extract or inject charges so as to reduce or increase the set threshold of the programmable transistor until the differential stage switches, thus indicating it is balanced, at which point the programming voltage is cut off immediately. This therefore provides for setting the correct threshold level to switch the differential stage at the required voltage value and so eliminate any offset in the stage.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
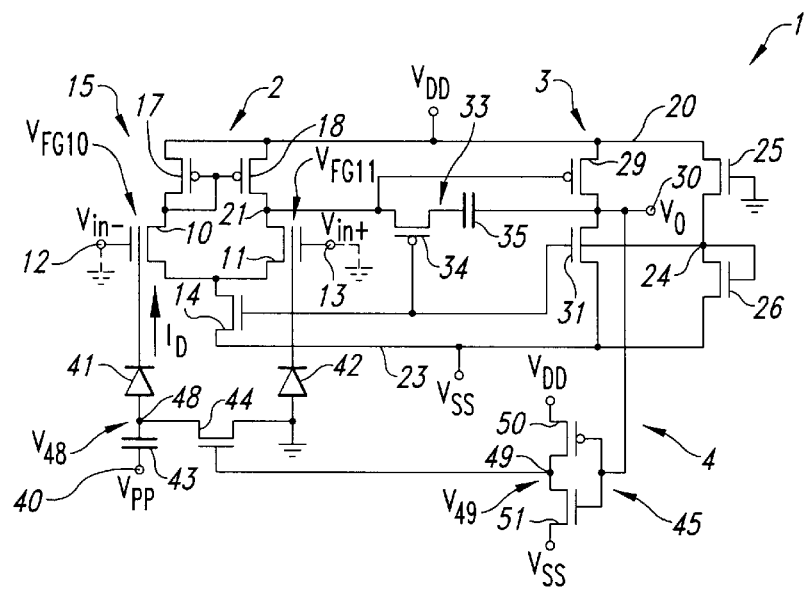
FIG. 1 shows an operational amplifier offset-compensated according to the present invention.

Number 1 in FIG. 1 indicates an operational amplifier comprising a differential input stage 2 and an output stage 3. In addition, amplifier 1 also comprises an offset compensating section 4 implementing the principle of the present invention.

Figure 2:
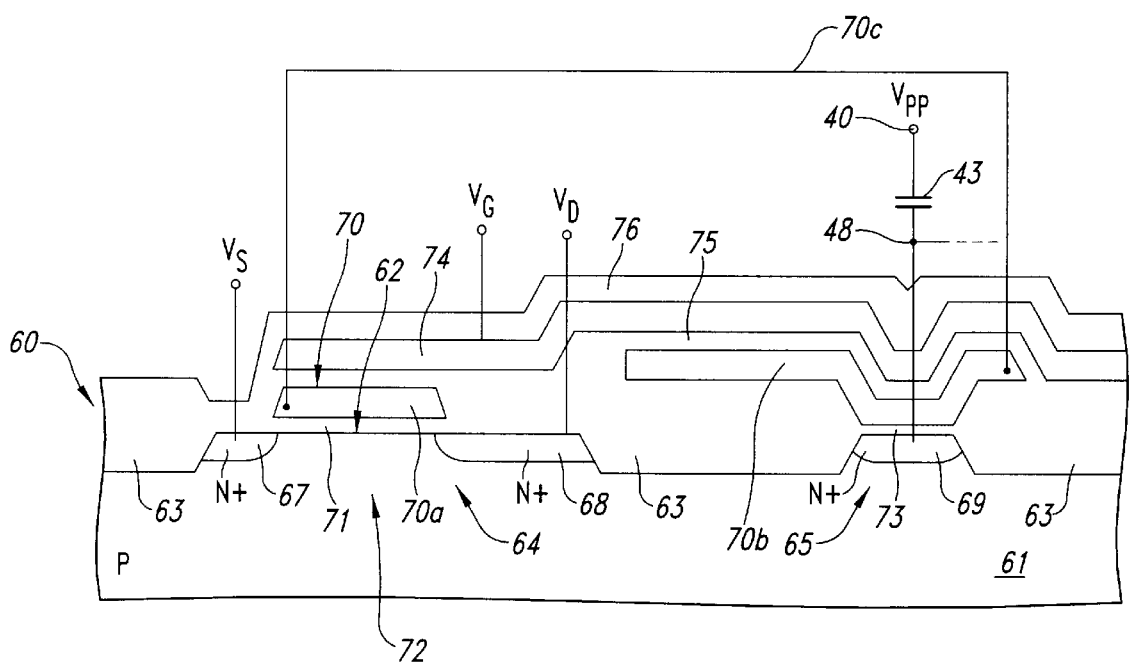
FIG. 2 shows a cross section of a semiconductor material wafer implementing a detail of the FIG. 1 circuit.

More specifically, differential input stage 2 comprises a pair of transistors 10, 11 in the form of programmable floating gate transistors as shown in the FIG. 2 section. Transistors 10 and 11 are N-channel types with the control gate terminals defining differential inputs 12, 13 of amplifier 1, the source terminals connected to each other and to the drain terminal of a biasing transistor 14, and the drain terminals connected to a current mirror circuit 15.

Current mirror circuit 15 comprises a first and second P-channel MOS transistor 17, 18 with the source terminals connected to each other and to an upper supply line 20 at $V_{DD}$, and the gate terminals connected to each other; transistor 17 is diode-connected, with the drain terminal connected to the drain terminal of floating gate transistor 10; and transistor 18 has the drain terminal connected to the drain terminal of floating gate transistor 11 at the output node 21 of the differential stage.

Transistor 14 is an N-channel type with the source terminal connected to a negative supply line 23 at $V_{ss}$ (typically equal to $-V_{DD}$) and the gate terminal connected to a biasing node 24, which is also connected to the source terminal of an N-channel transistor 25 and the drain terminal of an N-channel transistor 26. Transistor 25 is a resistive type with the drain terminal connected to positive supply line 20 and the gate terminal grounded; and transistor 26 is diode-connected, with the source terminal connected to negative supply line 23.

Output stage 3 comprises a PMOS output transistor 29, and an NMOS transistor 31 defining an active load. More specifically, transistor 29 has the gate terminal connected to node 21, the source terminal connected to positive supply line 20, and the drain terminal forming the output terminal 30 of amplifier 1; and transistor 31 has the drain terminal connected to output terminal 30, the gate terminal connected to biasing node 24, and the source terminal connected to negative supply line 23.

Output terminal 30 is also connected to node 21 via a frequency compensating network 33 comprising a P-channel resistive transistor 34, and a capacitor 35. More specifically, compensating transistor 34 has the gate terminal connected to biasing node 24, a first (drain) terminal connected to node 21, and a second (source) terminal connected to output terminal 30 of amplifier 1 via compensating capacitor 35.

Offset compensating stage 4 comprises a programming terminal 40; a pair of MOS tunnel diodes 41, 42, each connected to the floating gate of a respective transistor 10, 11; a coupling capacitor 43; a program disabling transistor 44; and an inverting circuit 45.

More specifically, diode 41 has the cathode connected to the floating gate of transistor 10 (as explained in more detail below with reference to FIG. 2), and the anode connected to a node 48 in turn connected to programming terminal 40 via capacitor 43 (which is so sized as not to be noticeably discharged by the tunnel current during programming, but to be rapidly discharged by the channel current of transistor 44 when this is turned on, as explained in more detail later on). Diode 42 has the cathode connected to the floating gate of transistor 10, and the anode grounded; NMOS program disabling transistor 44 has the drain terminal connected to node 48, the source terminal grounded, and the gate terminal connected to output 49 of inverting circuit 45; and inverting circuit 45 comprises a pair of respectively PMOS and NMOS transistors 50, 51 with the gate terminals connected to each other and to output terminal 30 of amplifier 1, the drain terminals connected to each other and forming output 49, and the source terminals connected respectively to positive supply line 20 and negative supply line 23.

One example of the implementation and connection of tunnel diodes 41, 42 to respective input transistors 10, 11 is shown in FIG. 2, which shows a cross section of a semiconductor material wafer 60. More specifically, 61 in FIG. 2 indicates a P-type substrate of monocrystalline silicon defining a surface 62 on which are formed thick field oxide regions 63 laterally delimiting an active region 64 for programmable transistor 10 (or 11), and an active region 65 for tunnel diode 41 (42). Substrate 61 houses an N+ type source region 67, an N+ type drain region 68 (both located in active area 64 and separated by a portion of substrate 61 forming the channel 72 of transistor 10, 11), and an N+ type anode region 69 (in active area 65) shown connected to capacitor 43. A polysilicon layer (poly1) 70 extends from active area 64 to active area 65; layer 70 of FIG. 2 shows two portions 70a, 70b respectively over channel 72 and over anode region 69 and part of field oxide region 63. Portions 70a, 70b are connected to each other by a portion (not shown, and represented schematically by electrical connection 70c) in which the standard programming injector (not shown) of the programmable transistor is also formed.

Portions 70a, 70b are separated electrically from surface 62 by a gate oxide layer 71 and a tunnel oxide region 73. More specifically, tunnel oxide region 73 is very thin (e.g., 80 Å), whereas gate oxide layer 71 is thicker (about 200 Å), covers channel 72, and merges with field oxide region 63.

A second layer of polycrystalline silicon (poly2) 74 extends over poly1 layer 70, and is separated from it by a dielectric layer 75 which merges locally with gate oxide layer 71 and field oxide region 63; and a protective oxide layer 76 extends over poly2 layer 74.

As shown in FIG. 2, transistors 10, 11 are formed in the same way as standard EEPROM memory cells, except that poly1 layer 70, which is fully insulated, extends up to active area 65 to form tunnel diode 41, 42.

Figure 3:
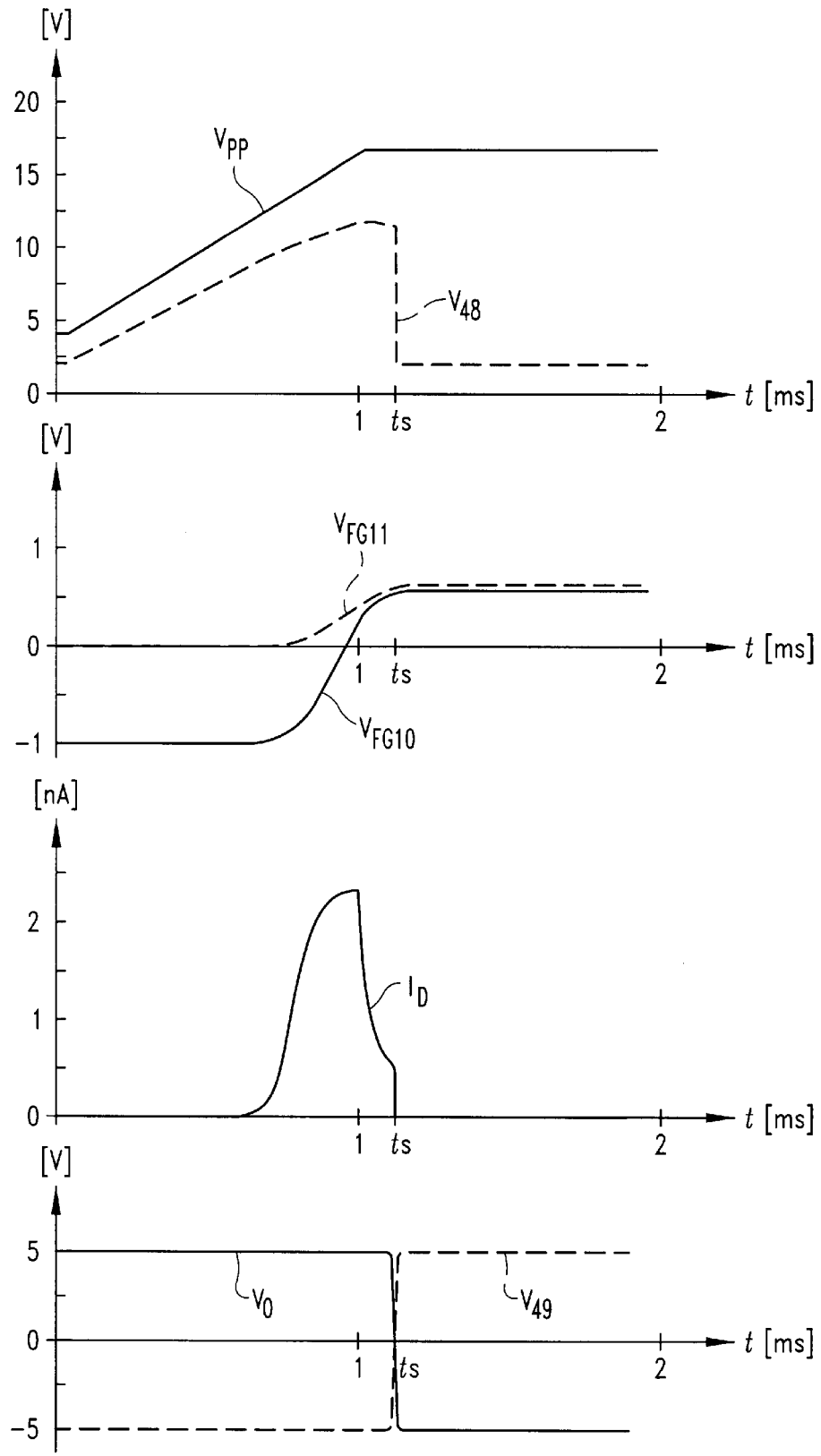
FIG. 3 shows graphs of a number of electric signals at appropriate points on the FIG. 1 amplifier.

Operation of the FIG. 1 circuit will now be described with reference also to FIG. 3, which plots programming voltage $V_{PP}$ (voltage $V_{48}$) measured at node 48; voltages $V_{FG10}$ and $V_{FG11}$ measured at the floating gate regions of input transistors 10, 11; current $I_D$ flowing through diode 41; output voltage $V_o$; and output voltage $V_{49}$ of inverter 45.

Initially, transistor 10 is programmed to the high-threshold state (excess charges in the floating gate) so that it is off regardless of biasing of input terminal 12; transistor 11 is programmed to a predetermined nominal threshold value which remains unchanged; and initial programming may be performed as customary for nonvolatile memory cells, by appropriately biasing the drain, source and gate terminals of transistors 10, 11.

During calibration, amplifier 1 is supplied normally, and inputs 12, 13 are grounded as shown by the dotted line in FIG. 1. Since transistor 10 is off, output terminal 30 is at high potential (nearly $V_{DD}$); node 49 is at low potential (nearly $V_{SS}=-V_{DD}$); program disabling transistor 44 is off; the programming node is initially low (0 V); and diode 41 is disabled.

To calibrate the differential stage, a positive voltage pulse is applied to terminal 40. Voltage $V_{PP}$ is preferably increased linearly as shown in FIG. 3; node 48 is brought to high by capacitive coupling via capacitor 43 (see voltage $V_{48}$ in FIG. 3). When voltage $V_{PP}$ reaches such a value as to cause across diode 41 a direct voltage drop equal to its threshold voltage (here about 10 V), diode 41 starts conducting and generates a current to the floating gate region of transistor 10, i.e., extracts electrons from the floating gate by Fowler-Nordheim tunneling (current $I_D$). Thus, the floating gate voltage $V_{FG10}$ of transistor 10 increases and the threshold of transistor 10 decreases.

The threshold voltage of transistor 10 continues decreasing until input stage 2 of amplifier 1 reaches an electrically balanced condition.

If differential input stage 2 were ideal, such a balance condition would occur when the charge stored in the floating gate of transistor 10 equals the charge stored in the floating gate of transistor 11. In general, however, stage 2 is not ideal, and the balance condition occurs at different charge values. At any rate, upon the differential stage reaching a balance condition, output voltage $V_o$ switches to low (instant $t_8$ in FIG. 3) and voltage $V_{49}$ at output node 49 of inverter 45 switches to high; program disabling transistor 44 is therefore turned on and grounds node 48, thus discharging capacitor 43 and sharply arresting tunnel injection via diode 41. Thus, the charge stored in the floating gate of input transistor 10 is frozen at the value by which the output was switched, i.e., in a situation in which, with equal inputs, the output of amplifier 1 is practically zero. As shown in FIG. 3, this condition corresponds to equal floating gate voltages of transistors 10, 11.

In the circuit shown, diode 42 provides for ensuring maximum balance of differential stage 2.

The method and circuit described present the following advantages. In particular, they provide for highly simple, accurate offset compensation (up to about 1 mV) by requiring only a small number of easy-to-integrate components, and by virtue of compensation substantially depending on the gain of the feedback branch, which may be made very high.

Clearly, changes may be made to the method and circuit as described and illustrated herein without, however, departing from the scope of the present invention. In particular, the method described may be implemented using a circuit other than the one shown, using different nonvolatile memory cells (EEPROM, flash and EPROM), even located differently in the differential scheme (e.g., in the current mirror), or using different e.g., hot-electron, programming methods; all of which variations have in common the storage, in the floating gate of one or more nonvolatile memory cells, of the charge required to eliminate the offset of the circuit.

Moreover, the correct charge condition to switch the differential stage may be achieved conversely to the manner described, and more specifically by commencing from an erasing situation in excess of the normal one set on the other transistor of the differential stage, and by injecting electrons until the threshold corresponding to the desired switching situation is reached. In which case, programming will comprise writing programmable transistor 10 instead of erasing it as in the example described, so that the term programming used herein comprises both methods of modifying the threshold of transistor 10.

Moreover, as opposed to interrupting programming of the nonvolatile compensating element by direct feedback of the output voltage, the programming voltage may be applied cyclically and interrupted periodically to check attainment of the balance situation, with no direct feedback involved.

Finally, the same may also be achieved for offset compensating the differential stages of comparators required to switch at predetermined input voltage values, by setting the required switching value at the input of transistor 11.

We claim:
1. A differential amplifier with offset compensation, comprising:
  a differential input stage including a floating gate transistor having a control terminal defining a first input of the differential input stage;

an output stage having an output and an input connected to the differential input stage; and an offset compensating stage having an input connected to the output of the output stage and an output connected to a floating sate of the floating gate transistor, the offset compensating stage operable to apply a programming voltage to the floating gate until the output of the output stage switches, wherein the offset compensating stage includes:

a programming circuit for programming the floating gate transistor to a selected threshold value, wherein the programming circuit includes:

a capacitor having an input for receiving the programming voltage, and a tunneling diode connected in series between the capacitor and the floating gate;

a detector to detect switching of the output stage, and a disabling circuit connected to the programming circuit and the detector, the disabling circuit operable to prevent the programming circuit from applying the programming voltage to the floating gate in response to detection by the detector of the switching of the output stage.

2. A differential amplifier with offset compensation, comprising:

a differential input stage including a floating gate transistor having a control terminal defining a first input of the differential input stage:

an output stage having an output and an input connected to the differential input stage; and an offset compensating stage having an input connected to the output of the output stage and an output connected to a floating gate of the floating gate transistor, the offset compensating stage operable to apply a programming voltage to the floating gate until the output of the output stage switches, wherein the offset compensating stage includes:

a programing circuit for programming the floating gate transistor to a selected threshold value;

a detector to detect switching of the output stage; and a disabling circuit connected to the programming circuit and the detector the disabling circuit operable to prevent the programming circuit from applying the programming voltage to the floating gate in response to detection by the detector of the switching of the output stage, wherein the disabling circuit comprises a MOS transistor connected between the programming circuit and a reference potential, the MOS transistor having a gate connected to the detector.

3. The differential amplifier according to claim 2 wherein the detector comprises an inverter.

4. The differential amplifier according to claim 2 wherein the differential input stage further includes a second floating gate transistor having a control terminal defining a second input of the differential input stage.

5. The differential amplifier according to claim 2 wherein the MOS transistor operates as a switch connected between the floating gate transistor and the reference potential to remove the programming voltage from the floating gate.

6. A differential amplifier with offset compensation, comprising:

a differential input stage including a floating gate transistor having a control terminal defining a first input of the differential input stage;

an output stage having an output and an input connected to the differential input stage: and an offset compensating stage having an input connected to the output of the output stage and an output connected to a floating gate of the floating gate transistor, and having a switch connected between the floating gate transistor and a reference ground, the offset compensating stage operable to apply a programming voltage to the floating gate until the output of the output stage switches, the switch to remove the programming voltage from the floating gate, wherein the switch includes a MOS transistor.

7. A differential amplifier having offset compensation, comprising:

a differential stage including a pair of differentially connected floating gate transistors each having a control terminal defining an input of the differential stage; and an offset compensating stage having an input connected to an output of the differential stage and an output coupled to the differential stage, and including a switch coupled to a program-preventing voltage, the switch controlled by the output of the differential stage, the offset compensating stage operable to apply a programming voltage at its output to change the threshold voltage value of the one of the floating gate transistors until the output of the differential stage switches, and when the differential stage switches, operable to couple the one of the floating gate transistors to the program-preventing voltage.

8. The differential amplifier according to claim 7 wherein the offset compensating stage comprises:

a programming circuit for programming the one of the floating gate transistors to a selected threshold value;

a detector to detect switching of the differential stage; and the switch connected to the programming circuit and the detector, the switch operable to prevent the programming circuit from applying the programming voltage to the floating gate in response to detection by the detector of the switching of the differential stage.

9. The differential amplifier according to claim 7, further comprising an output stage having an input connected to the output of the differential stage and an output connected to the input of the offset compensating stage, wherein the offset compensating stage is operable to apply the programming voltage until the output of the output stage switches.

10. A differential amplifier having offset compensation, comprising:

a differential stage including a pair of differentially connected floating gate transistors each having a control terminal defining an input of the differential stage; and an offset compensating stage having an input connected to an output of the differential stage and an output connected to a floating gate of one of the floating gate transistors, the offset compensating stage operable to apply a programming voltage at its output to change the threshold voltage value of the one of the floating gate transistors until the output of the differential stage switches, wherein the offset compensating stage includes:

a programming circuit for programming the one of the floating sate transistors to a selected threshold value;

a detector to detect switching of the differential stage; and a disabling circuit connected to the programming circuit and the detector, the disabling circuit operable to prevent the programming circuit from applying the programming voltage to the floating gate in response to detection by the detector of the switching of the differential stage, wherein the disabling circuit includes a switch connected between the programming circuit and a reference ground to remove the programming voltage from the floating gate of the one of the floating gate transistors.

11. The differential amplifier according to claim 10 wherein the switch includes a MOS transistor.

12. A differential amplifier having offset compensation, comprising:

a differential stage including a pair of differentially connected floating gate transistors each having a control terminal defining an input terminal of the differential stage; and an offset compensating stage having an input connected to an output of the differential stage and an output connected to a floating gate of one of the floating gate transistors, the offset compensating stage operable to apply a programming voltage at its output to change the threshold voltage value of the one of the floating gate transistors until the output of the differential stage switches, wherein the offset compensating stage includes a switch connected between the one of the floating gate transistors and a reference ground to remove the programming voltage from the floating gate of the one of the floating gate transistors and wherein the switch includes a MOS transistor.

13. A circuit as claims in claim 12, wherein the offset compensation stage further includes:

programming means for programming the one of the floating gate transistors to a threshold value other than a required threshold;

first source means for generating a balance input voltage connected to the input terminals of said differential stage;

second source means for generating the programming voltage connected to the one of the floating gate transistors; and detecting means for detecting switching of said differential stage and operating the switch to remove said second source means.

14. A circuit as claimed in claim 13, characterized in that the one of the floating gate transistors is an input transistor of said differential stage.

15. A circuit as claimed in claim 13, characterized in that said detecting means comprise an inverting stage connected to the output of said differential stage.

16. A circuit for compensating the offset of a MOS differential stage comprising:

an electrically programmable MOS transistor;

an offset programming stage for modifying the threshold of said MOS transistor, the offset programming stage including a switch coupled between said MOS transistor and a program-preventing voltage, the offset programming stage operable to couple said MOS transistor to the program-preventing voltage responsive to an output of the differential stage.

17. A circuit for compensating the offset of a MOS differential stage comprising:

an electrically programmable MOS transistor having a floating gate region;

first source means for generating a balance input voltage connected to input terminals of said differential stage;

second source means for generating a threshold-modifying programming voltage connected to said MOS transistor, wherein said second source means includes a coupling capacitor and a tunnel diode series connected to each other between a programming input terminal and said floating gate region;

monitoring means for continuously monitoring an output of said differential stage; and a disabling MOS transistor with a first terminal connected to an intermediate point between said capacitor and said tunnel diode, a second terminal connected to a reference potential line, and a control terminal connected to said monitoring means.

18. A circuit as claimed in claim 17, characterized in that said tunnel diode comprises a first region formed in a substrate of semiconductor material, and a second region facing and electrically separated from said substrate; said second region being connected to said floating gate region.

19. A circuit as claimed in claim 17, characterized in that said floating gate region and said second region of said tunnel diode are formed in contiguous portions of a polycrystalline silicon layer.

20. A circuit as claimed in claim 17, characterized in that said differential stage comprises a second electrically programmable input MOS transistor.

21. A differential amplifier comprising:

an input stage including a floating gate transistor; and a compensation stage including a switch controlled by an output of the input stage the compensation stage operable to couple the floating gate transistor either to a programming voltage or to a program-preventing voltage, responsive to the output of the input stage.

22. The differential amplifier of claim 21 wherein the switch is an MOS transistor coupled between the floating gate and the program-preventing voltage, and having a gate coupled to the output of the input stage.

* * * * *

UNITED STATES PATENT AND TRADEMARK OFFICE
CERTIFICATE OF CORRECTION

PATENT NO. : 5,942,936
DATED : August 24, 1999
INVENTOR(S) : Bruno Riccio et al.

It is certified that error appears in the above-identified patent and that said Letters Patent is hereby corrected as shown below:

<u>Title page,</u>
Item [73], the assignee should read -- STMicroelectronics, S.r.l. --

Signed and Sealed this

Twenty-sixth Day of February, 2002

*Attest:*

JAMES E. ROGAN
*Attesting Officer*   *Director of the United States Patent and Trademark Office*